United States Patent [19]

Araseki et al.

[11] 4,097,860
[45] Jun. 27, 1978

[54] OFFSET COMPENSATING CIRCUIT

[75] Inventors: Takashi Araseki; Kazuo Ochiai; Rikio Maruta, all of Tokyo, Japan

[73] Assignee: Nippon Electric Co., Ltd., Tokyo, Japan

[21] Appl. No.: 766,848

[22] Filed: Feb. 9, 1977

[30] Foreign Application Priority Data

Feb. 10, 1976 Japan ................................ 51-14144

[51] Int. Cl.² ...................... H03K 13/02; H03K 13/32
[52] U.S. Cl. ........................... 340/347 CC; 307/359; 328/165; 364/571
[58] Field of Search .............................. 235/152, 164; 340/347 CC; 307/354, 356, 359, 362; 328/149, 150, 165, 167

[56] References Cited

U.S. PATENT DOCUMENTS

| | | | |
|---|---|---|---|
| 3,533,098 | 10/1970 | Munoz | 340/347 CC |
| 3,824,588 | 7/1974 | Vermillion | 340/347 CC |
| 3,958,236 | 5/1976 | Kelly | 340/347 CC X |

*Primary Examiner*—Jerry Smith
*Attorney, Agent, or Firm*—Ostrolenk, Faber, Gerb & Soffen

[57] ABSTRACT

Method and apparatus for cancelling a deviation in an input signal due to drift, line or background noise, changes in circuit component characteristics due to aging, and the like wherein the input signal, typically a digitized representation of an analog signal, is altered by a presumed offset magnitude; the polarity of the difference is monitored and a negative or positive count of clock pulses is accumulated dependent upon the aforesaid polarity. When a determined positive (or negative) count is reached the presumed offset is adjusted (up or down) by a predetermined increment and the count is begun anew.

As an alternative technique and embodiment the initiation of the count may be restrained as long as the magnitude of the digitized input signal exceeds a predetermined threshold.

9 Claims, 5 Drawing Figures

U.S. Patent   June 27, 1978   4,097,860
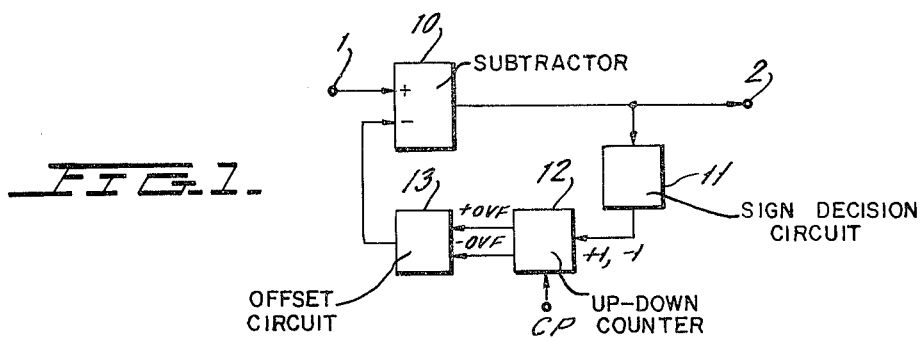
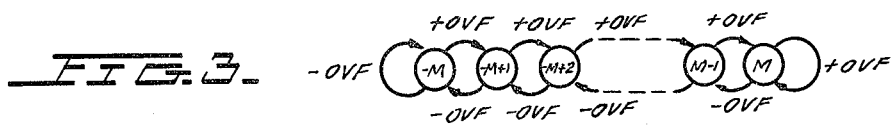
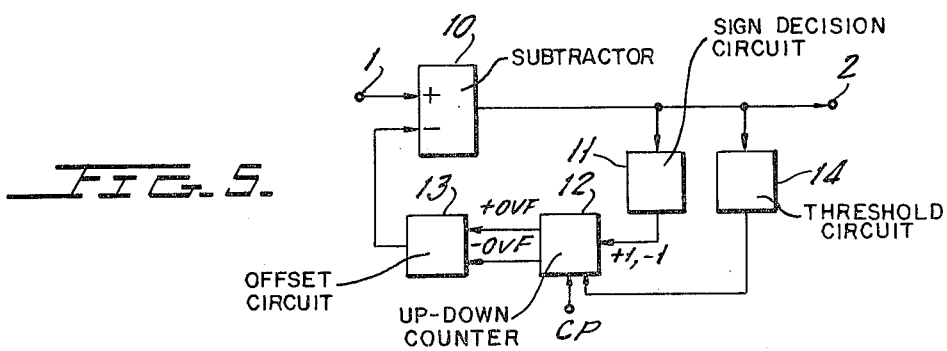
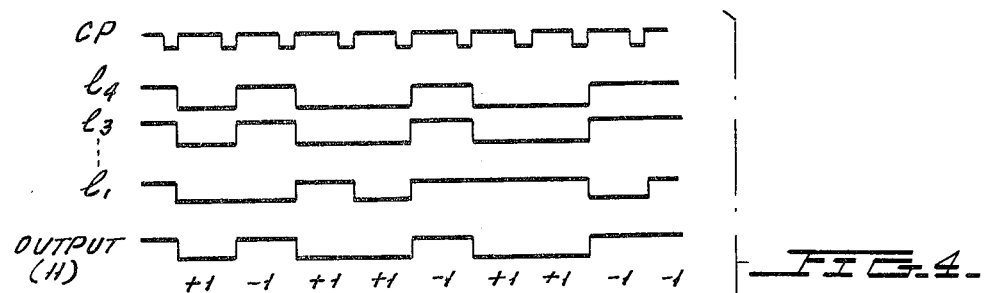

OFFSET COMPENSATING CIRCUIT

BACKGROUND OF THE INVENTION

The present invention relates to an offset compensating circuit for cancelling an ultra-low frequency component including the direct current component generated by a drift and the like in an A-D converter upon digitization of signals such as a speech signal.

With a recent development of a digital technique, it has become a common practice to digitize an analog signal and then process the digitized signal in a computer or transmit the digitized signal through a communication channel. The digitization of the analog signal can not dispense with an A-D converter. While various formats have been proposed as a format of the digital signal subjected to an A-D conversion, one of the formats suitable for processing in a computer is to assign analog voltages from +V volts to −V volts to binary codes 01111 . . . 1 to 10000 . . . as shown in TABLE 1.

TABLE 1

| | |
|---|---|
| +V volts | 011........11 |
| | 011........10 |
| | . |
| | . |
| | . |
| | 000........10 |
| | 000........01 |
| 0 volts | 000........00 |
| | 111........11 |
| | 111........10 |
| | 111........01 |
| | . |
| | . |
| | 100........01 |
| −V volts | 100........00 |

This format is called 2's complement type. As will be seen from the table, though an analog signal of 0 volt should be converted to a digital signal of 000 . . . 00, practically due to various causes such as changes due to aging, temperature change, cross-talk, noise, etc. of the A-D converter, even if the analog signal of 0 volts is given to an input of the A-D converter, the output signal 000 . . . 00 is not always obtained. Such a zero level variation, that is, a drift is inevitable upon A-D conversion. Due to such a drift, even when there is no signal, sometimes the result of the A-D conversion does not become zero but shows a certain value that is varying with time. Such a deviation (or offset) from a null point would sometimes cause an undesirable result upon digital processing. More particularly, a large offset would cause a problem of narrowing the dynamic range of the signals represented by the binary codes, and in addition, even a slight offset would sometimes cause the following problems. For instance, on the assumption that upon data processing by a computer an input signal is restricted in band width, the offset would frequently cause a large operation error. Also, in a PCM communication channel, in the case where the operation of digital signals is not effected between a coder (A-D converter) and a decoder (D-A converter) and only the communication channel intervenes therebetween, the offset would cause almost no problem. However, in the case of performing any processing of the digital signals, there is a fear that problems similar to those described above in connection with the computer use may arise. Furthermore, in the case where an analog signal is a speech signal, either in the computer or in the digital communication, necessity for precisely slicing the speech signal would occur often. The slicing of the speech signal is effected for the purpose of reducing the amount of operations within the computer, or in the case of the PCM communication channel, it is required in a system for enhancing the line efficiency as is the case with a TDMA (time division multiple access)/DSI (digital speech interpolation), that is, the system in which a determination is made of whether or not the speech signal exists on the channel, and the transmission is carried out only when the speech signal exists, while during an idle time (the time when non-existence or absence of the speech signal has been recognized) the speech signal on a different channel is interpolated and transmitted.

Upon detection of the speech signal including a signal of very small amplitude such as a consonant-representing signal, it can be easily conjectured that the presence of the offset in the coder makes the detection of the small-amplitude signal difficult.

Especially, since the readjustment of the A-D converter after it has been adapted in an apparatus is very difficult, means for automatically compensating the offset becomes necessary. Heretofore, in a computer, for the purpose of eliminating the offset, a system in which input data are integrated, an amount of the offset is conjectured and whereby the offset is cancelled, or a system in which input data are passed through a digital filter to remove a super-low frequency component, has been employed. However, in order to cancel the offset by integrating the input data, a great number of memory elements are needed for storing the integrated values, and as a result, the memory capacity is increased to make the system costly to manufacture. On the other hand, the removal of the offset by employing the digital filter has a disadvantage that the system becomes complicated or the frequency characteristics of the signal is varied. The digitization of an analog signal in PCM communication is found in an article entitled "D2 channel Bank: Multiplexing and Coding" (by C. L. Dammann et al) in "THE BELL SYSTEM TECHNICAL JOURNAL" Vol. 51, No. 8, pp. 1675-1699, October issue, 1972. In the coder (A-D converter) shown in FIGS. 12 and 13 on pages 1692-1693 of this literature, a time period when no signal exists is selected, and during this period the output signal of the comparator (1 and DIGIT DET) is sampled and passed through the integrator AZS1 (C of FIG. 13) to be smoothed out, and then it is given to the input of said comparator. In this case, the drift cancellation is performed according to a criterion that the occurrence of frequencies of 1 and 0 in the output signal of the comparator may be equalized. However, such a method has a disadvantage in that, in order to achieve the drift compensation stably so as not to be affected by noise, a time constant of integration must be chosen which is large enough to maintain a high precision, and also a large number of bits are required for the operation and memory. Particularly, in the case where signals are time-division multiplexed as is the case with the PCM communication channel, the increase of a memory capacity and complexity of a system are serious problems which must be avoided.

BRIEF DESCRIPTION OF THE INVENTION AND OBJECTS

It is one object of the present invention to provide an offset compensating circuit with a simple circuit construction for compensating the offset of an A-D converter.

The present circuit comprises a subtractor for subtracting a presumed value of the offset from the input signal to form the output signal, a sign decision circuit for determining the polarity of the output signal of said subtractor circuit, a bidirectional counter having its count-up and count-down function controlled by the output signal of said sign decision circuit and adapted to produce respective output signals when it has overflowed in an increasing direction and in a decreasing direction and an offset setting circuit in which an internal setting value representing the presumed value of the offset is increased upon overflow of said counter in the increasing direction while said internal setting value is decreased upon overflow of said counter in the decreasing direction.

Furthermore, the present circuit comprises a subtractor for subtracting a presumed value of an offset from the input signal to form the output signal, a sign decision circuit for determining the polarity of the output signal of said subtractor circuit, a counter having its count-up and count-down function controlled by the output signal of said sign decision circuit and adapted to produce respective output signals when it has overflowed in an increasing direction and in a decreasing direction, an offset setting circuit in which an internal setting value representing the presumed value of the offset is increased upon overflow of said counter in the increasing direction while said internal setting value is decreased upon overflow of said counter in the decreasing direction and a threshold circuit for the inhibiting increasing and decreasing variations of said counter when the output value of said subtractor exceeds a predetermined value.

As described above, the feature of the present invention is found in that attention is paid only to the polarity (or algebraic sign) of an input signal and cancellation of the offset is effected so that occurrence probabilities of positive and negative signs may be equalized. More particularly, one feature of the present invention resides in the fact that the offset of the A-D converter is exactly presumed and is removed when a speech signal has a small amplitude or when only noise exists at the input side of the A-D converter, by making use of the nature of speech signal that in the case where a zero point of the converter is correct, the probabilities of the speech signal taking positive and negative values, respectively, would become equal to each other if they are observed over a long period of time, but the occurrence probabilities of the positive and negative signs are not equal if the speech signal having a large amplitude (a vowel) is observed for a short period of time, and that when the speech signal having a small amplitude (a consonant) or a background noise (a line noise and other noise) are predominant, the abovementioned occurrence probabilities of the positive and negative signs appears equal to each other even upon the short period of observation.

BRIEF DESCRIPTION OF THE FIGURES

Now the present invention will be described in more detail in conjuction with the accompanying drawings, in which:

FIG. 1 shows a block diagram of a first preferred embodiment of the present invention;

FIG. 2 shows a state-transition diagram of counter 12 of FIG. 1;

FIG. 3 shows a state-transition diagram of an offset setting circuit 13 of FIG. 1, FIG. 4 is a time chart for explaining the operation of the circuit shown in FIG. 1 in more detail; and FIG. 5 shows a block diagram of a second embodiment of the present invention.

DETAILED DESCRIPTION OF THE INVENTION AND PREFERRED EMBODIMENTS

In the present circuit of FIG. 1, only one channel is illustrated for simplicity of explanation, but this circuit construction can be easily extended to the case where a plurality of channels are time-division multiplexed. A speech signal fed to an input terminal 1 (that is, a signal subjected to analog-digital conversion in an A-D converter) has subtracted therefrom a presumed value of an offset by means of a subtractor 10, and a difference is obtained from an output terminal 2, and subsequently, the output signal is subjected to any digital processing (speech detection and other data processing operations). In addition, the output signal of the subtractor 10 is given to an input terminal of a sign decision circuit 11. The sign decision circuit 11 picks up only a sign bit representing either a positive sign corresponding to a low level state (a high level state) or a negative sign corresponding to a high level state (a low level state) out of the output signals from the subtractor 10, and applies the sign bit to a bidirectional counter 12 as an input signal for controlling its count-up and count-down function. Here, if the sign bit represents a positive sign, the contents of the counter 12 are increased by 1 in response to a clock pulse (CP), but if the sign bit represents a negative sign, the contents of the counter 12 are decreased by 1.

A transition diagram of the counter 12 is shown in FIG. 2. When the contents of the counter 12 continues to increase and the input signal for controlling the counter 12 makes the count in counter 12 exceed N, an overflow signal in an increasing direction +0VF is generated from the output terminal of the counter 12, and at the same time, the contents of the counter 12 are changed to 0. If the count in the counter 12 continues to decrease and the input signal for controlling the counter 12 makes the count in counter 12 exceed −N, an overflow signal in a decreasing direction −0VF is developed at the output terminal of the counter 12, and at the same time, the contents of the counter 12 are changed to 0. It is necessary to select the value of the above-referred value N at a most suitable value depending on the nature of the input signal and an apparatus to be connected at the stage subsequent to the present circuit. Assuming that the counter 12 consists of L bits, the number of states which the counter 12 can assume is $2^L$. Accordingly, in order to use almost all of these states effectively, it is desirable to select the maximum value of the contents of the counter 12 at $N = 2^{L-1} - 1$ and the minimum value of the same at $-N = -2^{L-1} + 1$. In addition, even if the variable range of the contents of the counter 12 is selected is the range of 0 to N, it does not affect the operation of the present offset compensating circuit. In this modified embodiment, upon overflow, the contents of the counter 12 is varied to a value that is approximately equal to N/2. In response to the overflow of the counter 12 in the increasing direction in the above-described manner, the contents of the offset setting circuit 13 (a presumed value of the offset) are increased by a predetermined number. On the contrary, in case where the counter 12 has overflowed in the decreasing direction, the contents of the offset setting circuit 13 are decreased by the predetermined number. The change of the contents of the offset setting circuit 13 is effected according to the state transition diagram shown in FIG. 3. More particularly, the contents of the offset setting circuit 13 are increased or decreased in response to the overflow at the counter 12 in the increasing direction or in the decreasing direction, respectively. Even if the contents of the circuit 13 continues to increase, it never exceeds the maximum value M. On the contrary, in case where the offset setting circuit 13 continues to decrease, the decrease never exceeds the minimum value $-M$. The contents of the offset setting circuit 13 are directly applied to one input terminal of the subtractor 10 as a presumed value of the offset, and thereby an offset cancelling operation is carried out. The maximum value and minimum value of the offset setting circuit 13 are selected on the basis of an expected maximum value of the drift. In FIG. 3, illustration is made with respect to the case where the contents of the offset setting circuit 13 vary each time by one. However, the step size of variation is determined generally depending upon the precision that is required in the processing performed after cancellation of the offset. More particularly, it could be selected to be equal to the maximum variation step satisfying the requirement of the processing apparatus in the subsequent stage, or it could be selected so that the offset setting circuit may have the minimum number of states.

Assuming that the signal appearing at the input terminal 1 is a parallel 4-bit data signal given through four signal wires, the subtractor 10 of FIG. 1 can be constructed by connecting, in cascade, inverters for inverting the output signal "1" or "0" given from the offset setting circuit 13 and 4-bit binary full adders (SN7483A) described on page 199 of "The TTL Data Book for Design Engineers" published in 1972 by TEXAS INSTRUMENTS INCORPORATED, and the subtraction operation can be carried out by applying the input signal and the inverted signal to the input terminals A1–A4 and B1–B4, respectively, of the aforementioned adders. In addition, the sign decision circuit 11 consists of an inverter for picking up only the most significant bit among the bits of the output signal fed from the subtractor 10 and inverting the same [when "1" (a high level state) of said most significant bit represents a negative sign and "0" (a low level state) of that bit represents a positive sign]. On the contrary, when the bit "1" represents a positive sign and the bit "0" represents a negative sign, the circuit 11 could be a mere signal line for passing only the most significant bit therethrough.

The counter 12 can be realized by making use of synchronous 4-bit up/down counters (SN74193) on page 428 of the aforesaid Data Book and in this construction, provision is made such that when a carry output (corresponding to $-0VF$ in FIG. 1) or a borrow output (corresponding to $-0VF$ of FIG. 1) is generated at its output terminal, the contents may be changed to 1000 (corresponding to the "0" state of the counter 12 of FIG. 2). Also, it is assumed that when the most significant bit is "1", it represents a positive sign, and when it is "0", it represents a negative sign.

Likewise, the offset setting circuit 13 can be realized by using the above-referred counters identified as SN74193. However, in this case, provision is made such that when a borrow output is generated at its output terminal, the contents of the counter may be held at 0000, and when a carry output is emitted at its output terminal, the contents of the counter may be held at 1111. In this case also, it is assumed that "1" of the most significant bit represents a positive sign, while "0" of the most significant bit represents a negative sign.

The changing mode of the contents of the counter 12 or the offset setting circuit 13 is shown in the following TABLE 2 in connection with an example of 4-bit construction. It is to be noted that in this exemplified case the maximum and minimum values are selected at +7 and −8, respectively.

TABLE 2

| | | |
|---|---|---|
| 1 1 1 1 | +7 | Maximum |
| 1 1 1 0 | +6 | |
| . | | |
| . | | |
| . | | |
| 1 0 0 1 | +1 | |
| 1 0 0 0 | 0 | |
| 0 1 1 1 | −1 | |
| 0 1 1 0 | −2 | |
| . | | |
| . | | |
| . | | |
| 0 0 0 1 | −7 | |
| 0 0 0 0 | −8 | Minimum |

Now the operation of the present circuit, for which it is assumed that the input signal at the input terminal is a parallel 4-bit data signal applied through four signal wires, will be described with reference to FIG. 4.

In FIG. 4, numerals in parentheses represent corresponding component circuits, and reference numerals $1_4$, $1_3$, $1_2$ and $1_1$ designate the respective bit signals in a parallel 4-bit data signal, in which $1_4$ designates a sign bit signal. Here it is assumed that when the sign bit signal is at a low level state the number represented by the parallel 4-bit data signal is positive, whereas when the sign bit signal is at a high level state the number is negative.

The state of the output signal of the sign decision circuit 11 changes upon a leading edge of a clock pulse CP, and the contents of the counter 12 changes as illustrated in this figure, so that an overflow signal (+0VF) is developed at the output. In response to this overflow signal (+0VF), the contents j of the offset setting circuit 13 changes by 1 (in the increasing direction) into j + 1. In this case, each of the input and output signal lines of the subtractor 10 consists of 4 wires, and among the 4 output signal wires one is connected to an input terminal of the circuit 11. The number of the wires of the remaining signal lines is the same as the lines illustrated in FIG. 1. The output signal of the circuit 13 representing a presumed value of the offset is fed to an input terminal of the subtractor 10, and thereby the offset is compensated. In this embodiment, the cancellation of the offset can be done very appropriately when no input signal exists or when a signal of a small amplitude is input. In the case of a signal input of a large amplitude, as noted previously the occurrence probabilities of the positive and negative signs during a short period of time are not always equal to each other. This problem can be resolved by increasing the number of the states of the counter 12 (that is equivalent to extending the observation period). In the case where the speech detection is performed after the offset has been cancelled using the present invention, it is necessary that the offset should be cancelled upon detecting the signal of the small amplitude, and when the signal of the large amplitude is inputted, the speech detection is not affected by the offset even if there exists any offset. Therefore, for speech detection, it is more desirable to reduce the number of the states of the counter 12. Thus, by reducing the number of the states of the counter 12, even a hum caused by a commercial power supply can be cancelled. Therefore, for the purpose of effecting speech detection on a PCM communication channel, it is desirable to select the values of N = 8 and M = 8. Especially, in the case where the input signal at the input terminal 1 of FIG. 1 is a PCM time-division multiplexed signal, it is possible to accomplish time-sharing operations corresponding to said input signal in the circuit of the present invention by constructing each of the offset setting circuit 13 and the counter 12 with one RAM (random access memory) and one adder.

In FIG. 5, which shows a second embodiment of the present invention, in addition to the circuit construction of the first embodiment a threshold circuit 14 is interposed. In the first embodiment, it was previously described that the number of the states of the counter 12 is increased for the purpose of eliminating fluctuation of a presumed value of the offset for a signal of a large amplitude such as a vowel-representing signal. However, since the increase of the number of the states would cause increase of a memory capacity, when the number of time-division multiplex of an input signal is enhanced, a problem of enlarging a memory would arise. Therefore, in the second embodiment, the consideration is given to solve the aforementioned problem by means of the threshold circuit 14 without increasing the number of the states of the counter 12. This threshold circuit 14 monitors the magnitude of the output signal of the subtractor 10 each time the input signal is incoming, and it functions to inhibit the count-up and count-down operations of the counter 12 when the magnitude of the signal exceeds a given threshold value $\theta$. If the threshold value $\theta$ is selected sufficiently smaller than an average value of magnitudes of vowels, at the time point of a vowel input, the probability of allowing count-up or count-down operation of the counter 12, that is, the probability of the output signal of the subtractor 10 taking a value between $-\theta$ and $+\theta$, would become very small. In addition, since the probability distribution of the amplitude between $-\theta$ and $+\theta$ becomes uniform, the occurrence probability of positive and negative signs would become equal to each other, so that the variation of the contents of the counter 12 becomes very small. Accordingly, there is no need to increase the number of the states of the counter 12 as is the case with the circuit construction of the first embodiment.

The threshold circuit 14 can be realized by means of a 4-bit magnitude comparator (SN7485) described on page 202 of the Data Book "The TTL Data Book for Design Engineers", and in this case it is only necessary to supply said threshold value $\theta$ to input terminals A0 – A3, the output signal of the subtractor 10 to input terminals B0 – B3, and the output signal at a terminal B>A representing that said output signal is larger than the threshold value $\theta$ to the counter 12 as an inhibit signal. Then, in the counter 12 it is only necessary to provide a known AND circuit in addition to the above-described 4-bit up/down counters (SN 74193).

Although the comparison in magnitude with a threshold value is done for each input sample in the threshold circuit 14 in the second embodiment, another method in which an average value of a signal amplitude is calculated and this average value is compared with the threshold value, is also thought of. Alternatively, the count-up and count-down function of the counter 12 are completely inhibited during the period when a signal having a large amplitude is kept applied to the counter 12, for example, during the entire period when vowels are continuing. Accordingly, in this case the threshold circuit 14 could be connected to the input terminal 1. Even in the case where the circuit 14 effects comparison in magnitude for each input sample value as described in the above embodiment, if the offset is sufficiently small with respect to the threshold value $\theta$, it is possible to connect the circuit 14 to the input terminal 1.

In addition, when the result obtained by the present offset compensating circuit is used for speech detection, it is also possible to use a signal amplitude information within a speech detector or the result of detection in place of the threshold circuit.

As described above, according to the present invention, there is provided an offset compensating circuit having an excellent offset cancelling capability with a very simple construction consisting of a subtractor and a counter.

What is claimed is:

1. An offset compensating circuit comprising: a subtractor for subtracting a presumed value of the offset from the input signal to form the output signal; a sign decision circuit for determining an algebraic sign of the output signal of said subtractor circuit; a clock pulse source; a bidirectional counter for counting pulses from said source having its count-up and count-down function controlled by the output signal of said sign decision circuit and adapted to produce respective output signals when it has overflowed in an increasing direction and in a decreasing direction; and an offset setting circuit in which an internal setting value representing the presumed value of the offset is increased upon overflow of said counter in the increasing direction while said internal setting value is decreased upon overflow of said counter in the decreasing direction.

2. The apparatus of claim 1 wherein said counter includes means for clearing the contents therein whenever the counter overflows in either the increasing or decreasing direction.

3. The apparatus of claim 1 further comprising means for limiting the absolute magnitude of the offset signal regardless of the receipt of further outputs from the counter.

4. An offset compensating circuit comprising: a subtractor for subtracting a presumed value of the offset from the input signal to form the output signal; a sign decision circuit for determining an algebraic sign of the output signal of said subtractor circuit; a clock pulse source, a bidirectional counter for counting pulses from said source and having its count-up and count-down function controlled by the output signal of said sign decision circuit and adapted to produce respective output signals when it has overflowed in either an increasing direction or in a decreasing direction; an offset setting circuit in which an internal setting value representing the presumed value of the offset is increased upon overflow of said counter in the increasing direction while said internal setting value is decreased upon overflow of said counter in the decreasing direction; and a threshold circuit for inhibiting the increasing and decreasing variations of said counter when the output value of said subtractor exceeds a predetermined value.

5. The apparatus of claim 4 wherein said counter includes means for clearing the contents therein whenever the counter overflows in either the increasing or decreasing direction.

6. The apparatus of claim 4 further comprising means for limiting the absolute magnitude of the offset signal regardless of the receipt of further outputs from the counter.

7. A method for substantially cancelling certain components within an input signal, which components contribute to a deviation from the true value which the input signal should represent comprising:

selecting an arbitrary offset value;

subtracting the offset value from the input signal;

detecting the polarity of the resulting difference signal; counting at a predetermined rate and in a direction (positive or negative) dependent upon the polarity of the difference signal;

altering the magnitude of the present offset value by a predetermined positive or negative increment when the aforesaid count respectively reaches either a predetermined positive or negative magnitude.

8. The method of claim 7 further comprising the steps of monitoring the input signal and restraining the counting operation whenever the input signal is above (or below) a predetermined positive (or negative) magnitude.

9. The method of claim 7 further comprising the step of limiting the absolute magnitude of the offset signal regardless of the fact that additional alterations are requested due to said count reaching said predetermined magnitude.

* * * * *